United States Patent [19]
Clemen et al.

[11] Patent Number: 5,473,574
[45] Date of Patent: Dec. 5, 1995

[54] MULTI-PORT STATIC RANDOM ACCESS MEMORY WITH FAST WRITE-THRU SCHEME

[75] Inventors: Rainer Clemen, Boeblingen; Klaus Getzlaff, Schoenaich, both of Germany

[73] Assignee: International Business Machines Corporation, Armonk, N.Y.

[21] Appl. No.: 14,031

[22] Filed: Feb. 5, 1993

[30] Foreign Application Priority Data

Feb. 6, 1992 [EP] European Pat. Off. ............. 92101965

[51] Int. Cl.$^6$ ..................................... G11C 8/00
[52] U.S. Cl. ................. 365/230.05; 365/184.04; 365/230.08; 365/233
[58] Field of Search .................. 365/189.04, 230.05, 365/233, 233.5, 185.05, 230.08

[56] References Cited

U.S. PATENT DOCUMENTS

| | | | |
|---|---|---|---|
| 4,984,204 | 1/1991 | Sato et al. | 365/230.05 |
| 5,001,671 | 3/1991 | Koo et al. | 365/230.05 |
| 5,062,081 | 10/1991 | Runaldue | 365/230.05 |
| 5,177,706 | 1/1993 | Shinohara et al. | 365/230.05 |

FOREIGN PATENT DOCUMENTS

| | | | |
|---|---|---|---|
| 0178163 | 10/1984 | European Pat. Off. | G11C 8/00 |
| 0440191A2 | 1/1990 | European Pat. Off. | G11C 8/00 |

*Primary Examiner*—Tan T. Nguyen

[57] ABSTRACT

A fast write-thru scheme is proposed for use in a multi-port static random access memory. This is achieved by operating the read and write ports of the SRAM circuitry in two separate but interleaved stages. In a first stage, a write path is set up comprising a write address decoder, an AND gate connected to a clock signal, the AND gate enabling a write port coupled to the latch of a memory cell. In the second stage, a read path is set up comprising a read address decoder selecting a read port, through which data is read from the cell latch to a data out buffer. To minimize the write-thru access time, the synchronous read path controlled by the read address is interleaved with the write path triggered by a write clock (CE), so that the read address is delayed with respect to the clock and the write addresses. Thus the write-thru access time becomes independent from the write time needed for overwriting the multi-port SRAM cell and equal to the read address access time achieved in a fully static or synchronous read operation.

14 Claims, 4 Drawing Sheets

5,473,574

MULTI-PORT STATIC RANDOM ACCESS MEMORY WITH FAST WRITE-THRU SCHEME

FIELD OF THE INVENTION

The invention concerns a multi-port memory with memory cells, bit lines, word lines, read ports and write ports, whereby the word line used for reading is selected by a read address decoder, and the word line used for writing is selected by a separate write address decoder. The invention further comprises a method for writing data through the multi-port memory cell.

BACKGROUND OF THE INVENTION

High-speed general purpose registers used in a central processing unit (CPU) are built up from multi-port static random access memories (SRAM). The multi-port SRAMs have n data input and data output ports and n separate write and read address ports. They are thus able to perform n separate data transfers during a single machine cycle. Such registers are normally required to possess so-called write-through capability, i.e. the data which is written into one of the storage cells of the memory via a write port is required to be read out through one or more read ports during the same cycle. This procedure is described in a number of prior art documents, including U.S. Pat. No. 4,157,586, "Technique For Performing Partial Stores in Store-Thru Memory Configuration," issued June 1979 to Gannon et al. and assigned to IBM.

An example of the realization of one such multi-port register is shown in FIG. 1, which is based on the implementation described in co-pending EP Published Application EP-A-0 434 852 (having a counterpart U.S. patent application Ser. No. 07/889,259, filed May 1992, continuation of Ser. No. 07/601,839, filed 23 Oct. 1990, abandoned) assigned to IBM. The depicted multi-port register 10 has only one write port 30 which is connected to a data input line 20. Three read ports 50a, 50b and 50c are each connected to separate data output lines 60a, 60b and 60c, respectively. A decoder 70 decodes the read addresses AR1, AR2, AR3 (one for each read port) and write address AW for the single write port appearing on lines 100a–c and 80, respectively, and selects the indicated word lines within a cell array 40. The cell array 40 comprises a number of asymmetrical static latches with separate buffers for driving the respective read ports, to enhance write-through speeds. A clock signal (CE) is provided on line 90 to the cell decoder 70 and to the cell array 40.

FIG. 2 shows a timing diagram for the write-through procedure carried out in conjunction with the multi-port array of FIG. 1. The write-through procedure is clocked from a clock signal (CE) and is edge triggered. The clock signal (CE) is used to strobe valid input data (DI) appearing on data input line 20 through the write port 30 into the cell array 40. Before the clock signal (CE) rises, the data input (DI) signal on data input line 20 and address signals (AW, AR) must be valid. The address signals comprise the write address signal (AW) indicating the write port address at which the input data (DI) on data input line 20 is to be written, and the read address signals (AR; AR1, AR2, AR3) indicating the address from which output data (DO; DO1, DO2, DO3) is to be output on data out lines 60a–c through read ports 50a–c, respectively. The minimum required set up time for the address signals (AW, AR) is shown on FIG. 2 as Ts.

The register 10 starts the write-through cycle as soon as the clock signal (CE) goes positive. The clock signal (CE) must be held high for a minimum time Tce until valid output data (DO) appears on the data output lines 60a–c after access time Tac, the time between when the read addresses are valid and valid output data appears on the output ports. Note that both the data input (DI) and address signals (AR, AW) must stay valid for longer than time Tce. The extra time these signals remain valid is denoted Th, and is referenced to the negative clock edge of CE. Before the next write cycle begins, the clock signal (CE) goes low.

The problem with this prior art solution is that the access time Tac is large since it comprises the time needed to overwrite the latch of the SRAM cell, as well as the time needed to read the data out of the cell. That is, note that a single decoder is used for both the read and write addresses. Because the decoder must decode the write addresses at the start of the cycle, all of its inputs (including the read addresses) must be valid at the time CE rises.

A prior solution to reducing timing dependencies imposed by clocks was the use of non-clocked SRAMs, in which no clocking is used to gate the address signals. See the general discussion at Cols. 1–2 of U.S. Pat. No. 4,845,676, entitled "Non-Clocked Static Memory Cell," issued to Lohlein et al. and assigned to IBM. However, in such systems typically the read and write addresses were provided at the same time, which would not address the problem discussed above. Moreover, having no clocking at all raises the possibility of erroneous memory operations due to mistimings of the respective memory operations, particularly during the access cycle.

Thus, a need exists in the art to avoid the long read access times of conventional clocked SRAMs, without introducing sufficient timing uncertainties to produce erroneous operations.

SUMMARY OF THE INVENTION

The object of the invention is therefore to produce a memory register and a method for operating the memory register in which the write-thru access time is reduced. This object is achieved by providing a static read word line to the memory cell and by clocking a write word line to the memory cell using a clock signal.

The clocked write word line is constructed by connecting the output of the write address decoder of the memory cell to an AND gate, the other input of which is connected to the clock signal. The memory cell of the memory register comprises a buffered latch, one node of which is connected to a write bit line and the other node of which is connected to a read bit line through a transfer device.

As the read address decoder is not clocked, the timing of the read address is no longer critical and thus it can be set up at a later time than the write address. A feature of the invention is that it results in a multi-port array that can be operated in a pipelined mode in which the write and read phases are interleaved. Note that this operation can be provided without concern that erroneous data might be read. This is because the write addresses remain clocked, which prevents sequential write cycles from occurring too quickly during a pipelined operational mode.

The general method for writing data through the cell comprises the following steps: placing data to be written onto the write bit line connected to the memory cell; strobing the write address from a write address port to a clocked write word line; overwriting the contents of a latch in the memory cell; setting up a read address to select a static read word line and reading data out of the latch in the memory cell onto a read bit line.

DESCRIPTION OF THE DRAWINGS

The foregoing and other features and advantages of the present invention will now be discussed in more detail below, with reference to the appended Drawing, having several Figures therein as follows.

DETAILED DESCRIPTION OF THE INVENTION

Figure 3:
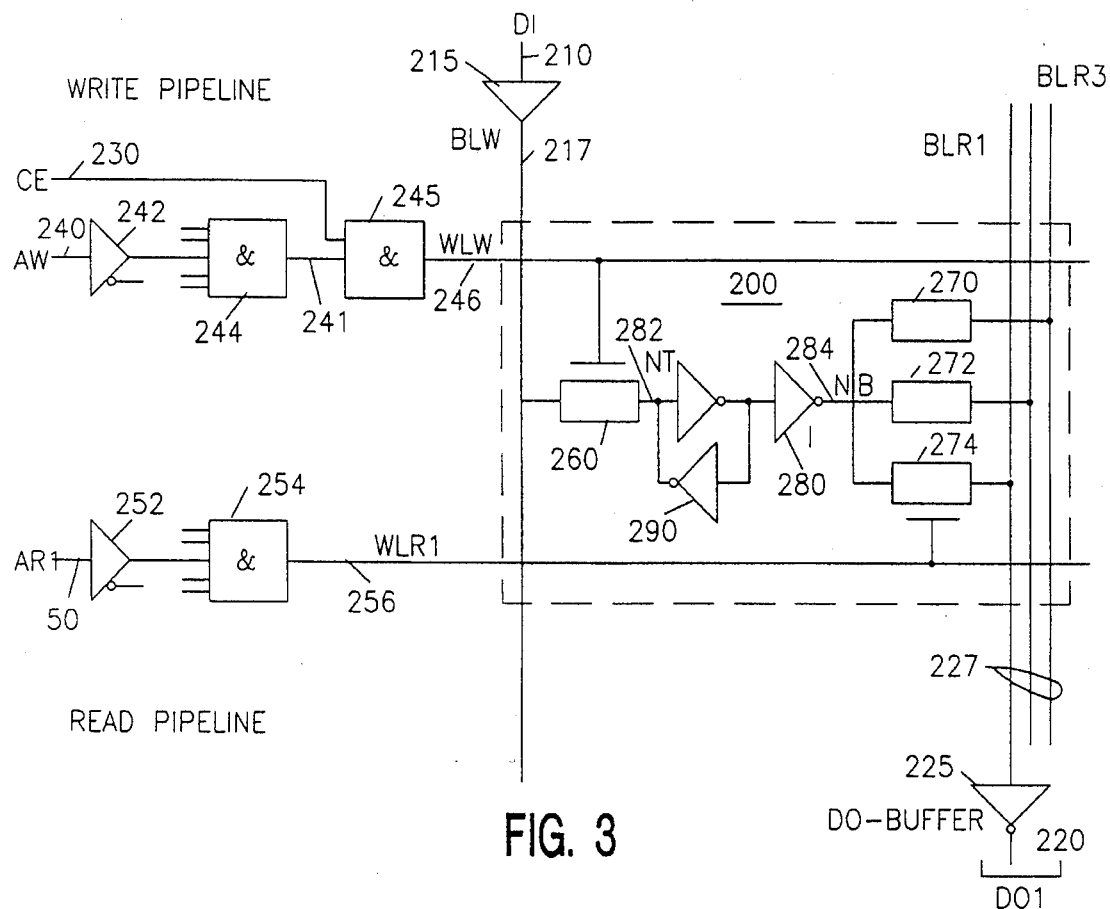
FIG. 3 shows a four-port SRAM employing constructed in accordance with the present invention.

FIG. 3 illustrates an embodiment of the current invention. It comprises a memory array having a plurality of four-port memory cells 200, each having with one write port 210 and three read ports 220. It is to be understood that the hatched box of the arrangement shown within FIG. 3 comprises one cell within an array, wherein the cells are coupled together by the various bit lines and word lines as described below. The write port 210 is connected to a data in buffer 215 that drives input data DI onto the write bit line BLW 217. The four—port memory cell shown is accessed by a clocked write word line WLW 246, and three separate static read word lines WLR 256. The read word lines 256 are, unlike the write word line 246, not clocked by a clock signal (CE) supplied to the memory register. For ease of illustration, in FIG. 3 only one of the read word lines 256 and output buffers 225 is shown. In addition to WLR1 256 coupled to device 274, there are separate write word lines coupled to devices 272, 270, respectively, of the same construction. Similarly, in addition to buffer 225 coupled to read bit line BLR1, there are also separate buffers coupled to BLR3 and the read bit line between BLR1 and BLR3, of the same construction.

A set of write address signals (AW) appear at write address port 240. Each of the address signals are buffered by separate write address buffers 242 (only one is shown for ease of illustration). Write address word decoder 244 decodes all of the write address signals (AW) and outputs a signal onto an output line 241 corresponding to the write word line having the cell into which data is to be written. This output line 241 is connected to an AND gate 245 whose other input is the clock signal (CE) on line 230. Thus, while the addresses may be input earlier, the selected write word line is not driven until CE becomes valid to begin the write cycle. Note that although it is preferred to use logic to gate the decoded addresses, the invention could be practiced by adding logic to the decoder itself to prevent it from operating until CE rises. This is not preferred because it could add delay, because now we cannot take advantage of any early decoding that can be carried out before CE rises. From the AND gate 245, the clocked signal is passed to the write word line 246 of the cell 200 into which data is to be written.

Read address signals (AR) appear at read address port 250 and are buffered by read address buffers 252. Read address word decoders 254 decode the read address signals (AR) and output a signal onto the read word line 256 corresponding to the cell 200 from which data is to be read. Note that there is no logic that gates the selection or drive of the read word lines as a function of CE. Thus, the read addresses can drive the selection and drive of the write word lines independent of chip enable clocking. As will be described in more detail below, because the write word line drive is synchronous with CE while the read word line drive is asynchronous, the read addresses select and drive the static read word lines later in the cycle, which both reduces the read access timing and enables the multi-port SRAM cells to be accessed and read in a pipelined fashion.

The memory cell 200 itself comprises a static CMOS latch 290 connected to one write port and three read ports, each arranged in a single ended configuration. The latch 290 consists of two cross-coupled inverters, which may be asymmetrical in the manner described in the aforementioned EP-A 0 434 852 application although not absolutely required for proper operation of the invention. That is, the devices in the output inverter could be relatively small to promote fast setting, and the devices in the feedback inverter (i.e. the inverter having its output coupled to node NT) could have a small pullup device and a pulldown device having a channel length much longer than the pullup, to set NT to a full high power supply potential when the signal on BLW is high. The write port is realized by an NFET transfer device 260 connected between a first latch node 282 of the latch 290 and a write bit line 217 which is in turn connected to the data in buffer 215. The NFET transfer device 260 is gated by the clocked write word line 246. Each of the cell read ports are realized by an NFET transfer device 270, 272, 274 connected between a second latch node 284 and the corresponding one of read bit lines 227 which are in turn connected to the data out buffers 225. The gates of the NFET transfer devices 270, 272, 274 are connected to the appropriate one of the static read word lines 256 (again, for ease of illustration only WLR1 coupled to device 274 is shown; the other read word lines are coupled to devices 270, 272 in the same manner and are of the same construction). The latch 290 is the cell flip-flop inverting latch, and an inverter buffer 280 is connected between the output of the latch 290 and the second latch node 284 in order to provide sufficient driving capability for the connected read bit lines.

Figure 4:
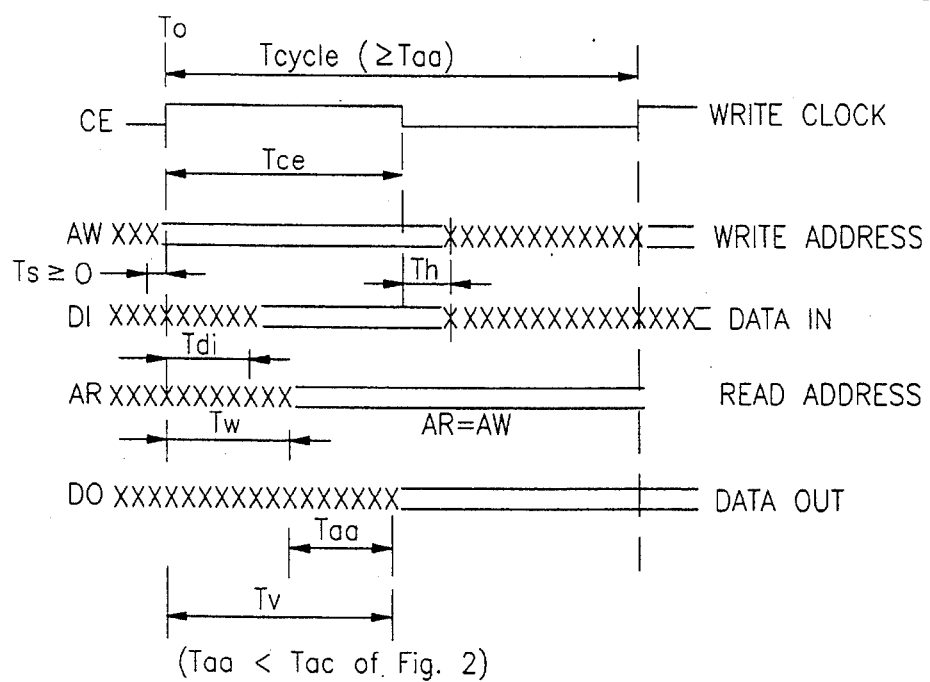
FIG. 4 shows a timing diagram of a write-thru procedure using the circuit of FIG. 3.

Referring now to FIG. 4, the write-thru operation of the circuit shown in FIG. 3 can be described. For the purpose of illustration, it is assumed that a logical '0' is initially stored in the latch 290 of the memory cell 200 and that the write bit line 217 is at an up-level as data is to be written into the latch 290 of the memory cell 200.

The first phase of the write-thru operation comprises a write pipeline operation which is initiated by the clock signal (CE) going high at time To as long as the write address (AW) has been previously set up at time Ts prior to To, as shown on FIG. 4. In the first stage of the write pipeline operation, the clock signal (CE) on the line 230 strobes, using the AND gate 245, the output of the fully static write address word decoder 244 along the clocked write word line 246 to the write port of the selected memory cell. In the second stage of the write pipeline operation, as the selected write word line 246 rises, the write port NFET 260 is turned on and pulls up the first latch node 282 (NT), thus overwriting the stored '0' in the latch 290. In the embodiment of the invention illustrated, the data on the write bit line 217 may become valid at a time Tdi after To as shown on FIG. 4. The up-level obtained at the first latch node 282 is inverted by the latch 290 and then reinverted by the attached inverter buffer 280 and thus also appears as an up-level at second latch node 284 (NB). After the value in the latch 290 has been overwritten, the write operation is completed and the latch 290 is ready for selection of the read port. The write word line 246 may be turned off at this stage in order to ensure that invalid data at the data in port 210 does not switch the state of the latch 290. After the clock signal (CE) has gone negative at time Tce after To, the write address signal (AW) must remain valid for a further period, hold time Th, after which it and the data in signal (DI) may become invalid.

The second phase of the write-thru operation comprises a read pipeline. A feature of the invention is that this operation can be started whilst the writing of the latch 290 of the memory cell 200 is being executed, and is initiated as soon as the read address signal (AR) becomes valid. In stage 1 of the read pipeline operation, the read address signal (AR) is decoded in the read address decoder 254, resulting in a select signal on one of the read word lines 256. The read address signal (AR) becomes valid at some time Tw after To as shown on FIG. 4. In stage 2, as the read word line 256 rises, the selected one of the read NFET transfer devices 270-274 is turned on.

Figure 1:
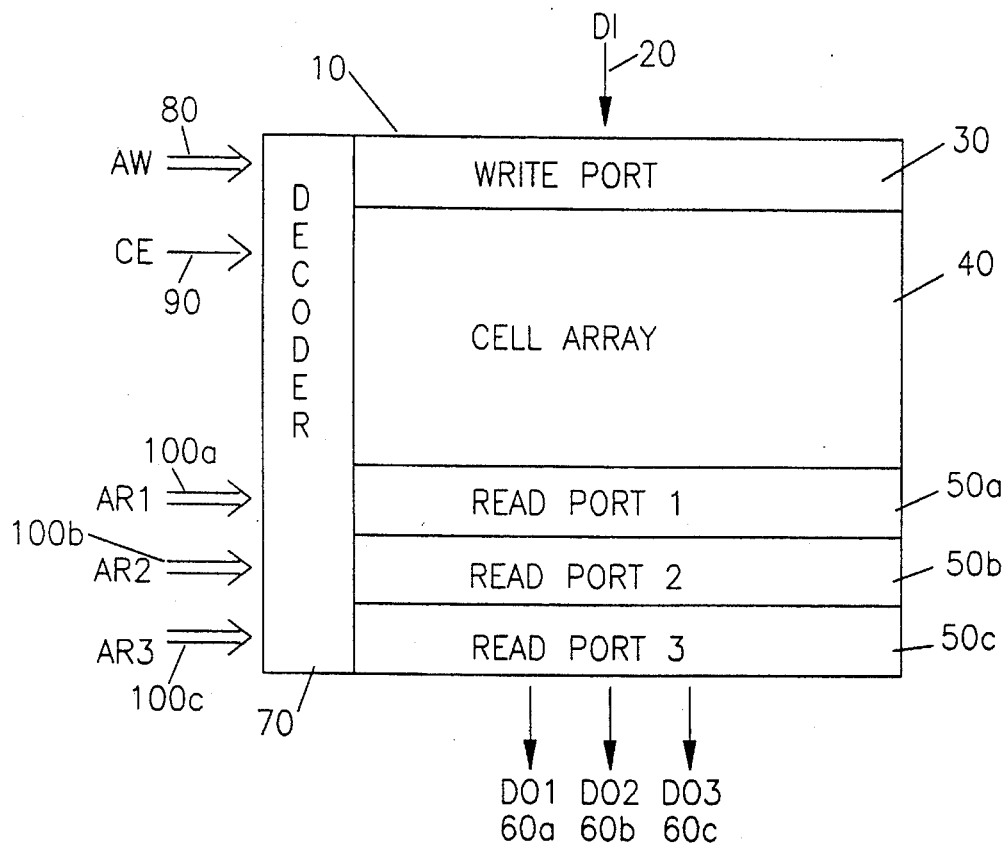
FIG. 1 shows a prior art implementation of a multiport register.
Figure 2:
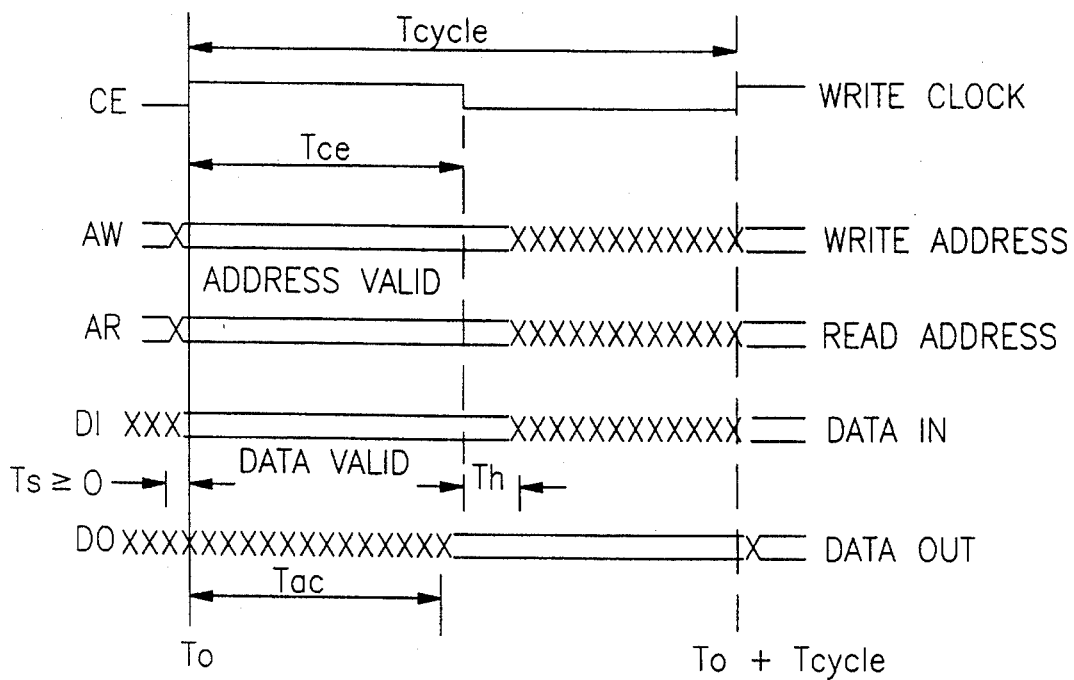
FIG. 2 shows a timing diagram of a write-thru procedure using the circuit of FIG. 1.

The inverter buffer 280 charges up the selected one of the read bit lines 227 and, after amplification by the output buffer 225, the overwritten cell data appears at the selected output ports 220 at a time Tv after To as shown on FIG. 4. The difference between the times Tv and Tw is denoted Taa and is the read address access time for the data in the cell. Note that it is shorter than the access time Tac shown on FIG. 2 for the prior art memory register shown in FIG. 1, because the read addresses are no longer constrained to be valid at the same time as the write addresses. As will be described in more detail below, allowing the read addresses to be valid later in the cycle facilitates the above-described pipelined operation.

Should the latch 290 originally be charged to '1' and need to be overwritten with a '0', this is carried out in a similar manner. The first latch node 282 is discharged from supply voltage to ground through the write port NFET 260 and this down-level signal propagates through the subsequent inverting stages and can be read out through the selected ones of the read port transfer NFETs 270-274 to the respective output port 220.

Figure 5:
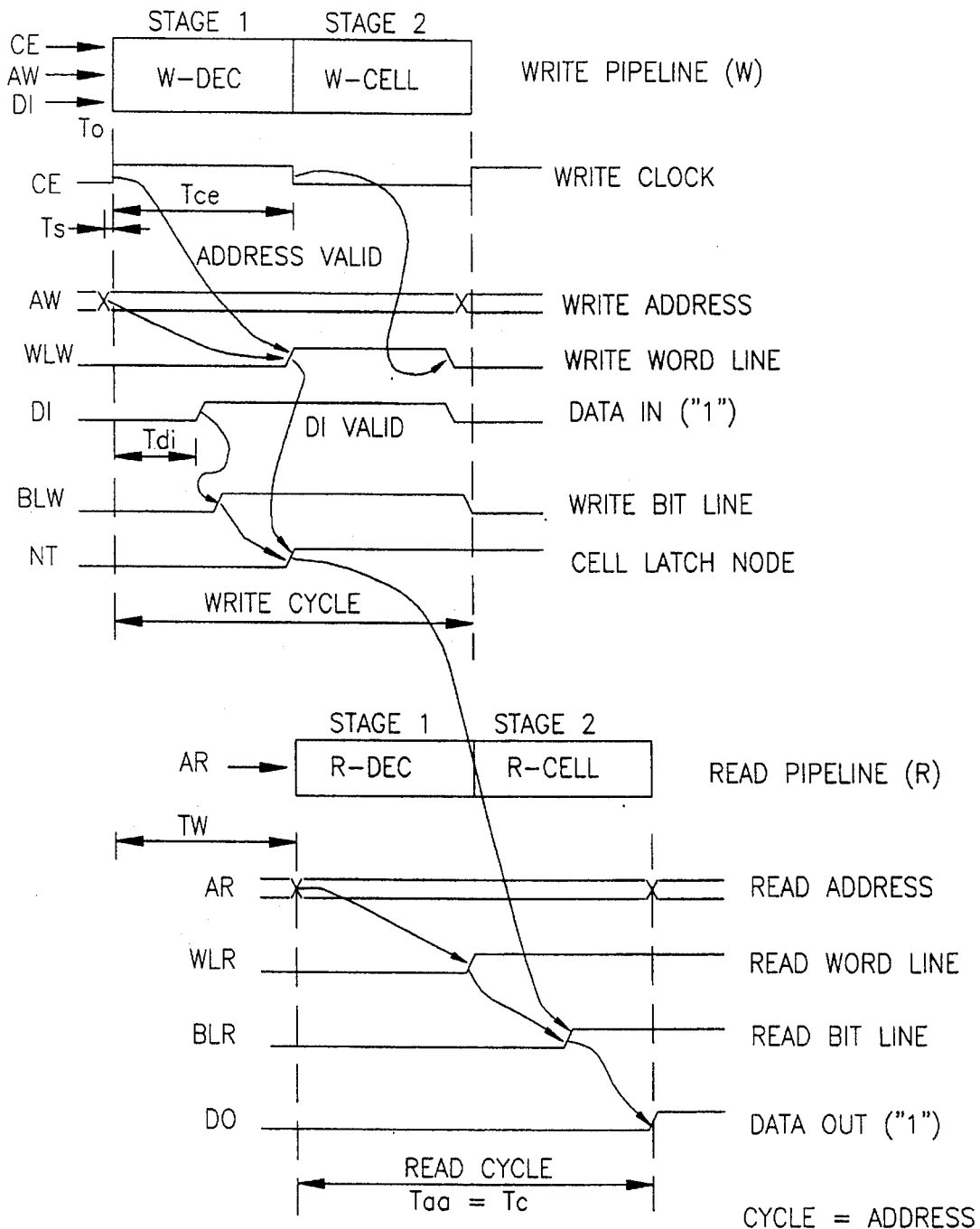
FIG. 5 shows a timing diagram of an interleaved operational mode using the circuit of FIG. 3.

A basic timing diagram of the external and internal signals of the invention is shown in FIG. 5 to illustrate the advantages of the invention over prior art solutions. The reference letters shown on the figure are the same as those used in FIGS. 3-4. The reference letters WLW indicate the signal developed on the write word line 246, BLW the signal developed on write bit line 217, WLR the signal developed on one of the read word lines 256, BLR the signal developed on one of the read bit lines 227 and NT the signal developed at the first latch node 282 of the memory cell 200.

The first phase of the write-thru operation is shown in the top half of FIG. 5 and comprises the write operation. As noted above and indicated on FIG. 5 it can be divided into two stages, the first stage ("STAGE 1") encompassing decoding of a write address (indicated as "W-DEC") and the second stage ("STAGE 2") compassing writing of the data into cell 200 (indicated as ("W-CELL"). Similarly the read operation shown in the bottom half of FIG. 5 is also divided into two stages, STAGE 1 encompassing the decoding of a read address ("R-DEC") and STAGE 2 encompassing the reading of data out of cell 200 ("R-CELL"). As shown by the staggered relationship of the write pipeline and read pipeline timing signals, in the pipelined access mode the read decode does not occur until approximately the same time as the cells are written with the write data; in other words, the read port is activated at approximately the same time the write port is deactivated.

As shown in FIG. 5, the write address signal (AW) is set up at a time Ts before the write clock signal (CE) goes positive at time To and has to remain valid until after the write clock signal (CE) falls at time Tce after To. These two signals are combined at the AND gate 245 and cause the signal on the write word line 246 to rise. At a time Tdi after To the data in signal (DI) appears and, if it is a '1' as shown in the example, it causes a write bit line signal (BLW) to appear on the write bit line 217. The effect of the write word line (WLW) and write bit line (BLW) signals is to cause the potential of the first latch node 282 to rise in the cell 200 when the cell is overwritten from a "0" to a "1" logic state as explained above (signal NT).

Unlike in the prior art apparatus, the read address signal (AR) does not have to be valid before the write clock signal (CE) rises. It becomes valid after time Tw after To. Thus, the read decode operation is initiated while the selected cell is being written with the new data. After the read decode operation is completed, the read word line signal (WLR) rises on the selected read word line 256. The effect of the rising of this signal is to couple the value at the first latch node 282 of the memory cell 200 to the selected read bit line 227 by enabling e.g. transfer device 274 as explained above. A rising read bit line signal appears on the selected read bit line ,227. After a delay, a data out signal (DO) appears at output 220. The read address access time Taa is shown on FIG. 5 as the length of the read cycle starting at time Tw after To.

Figure 6:
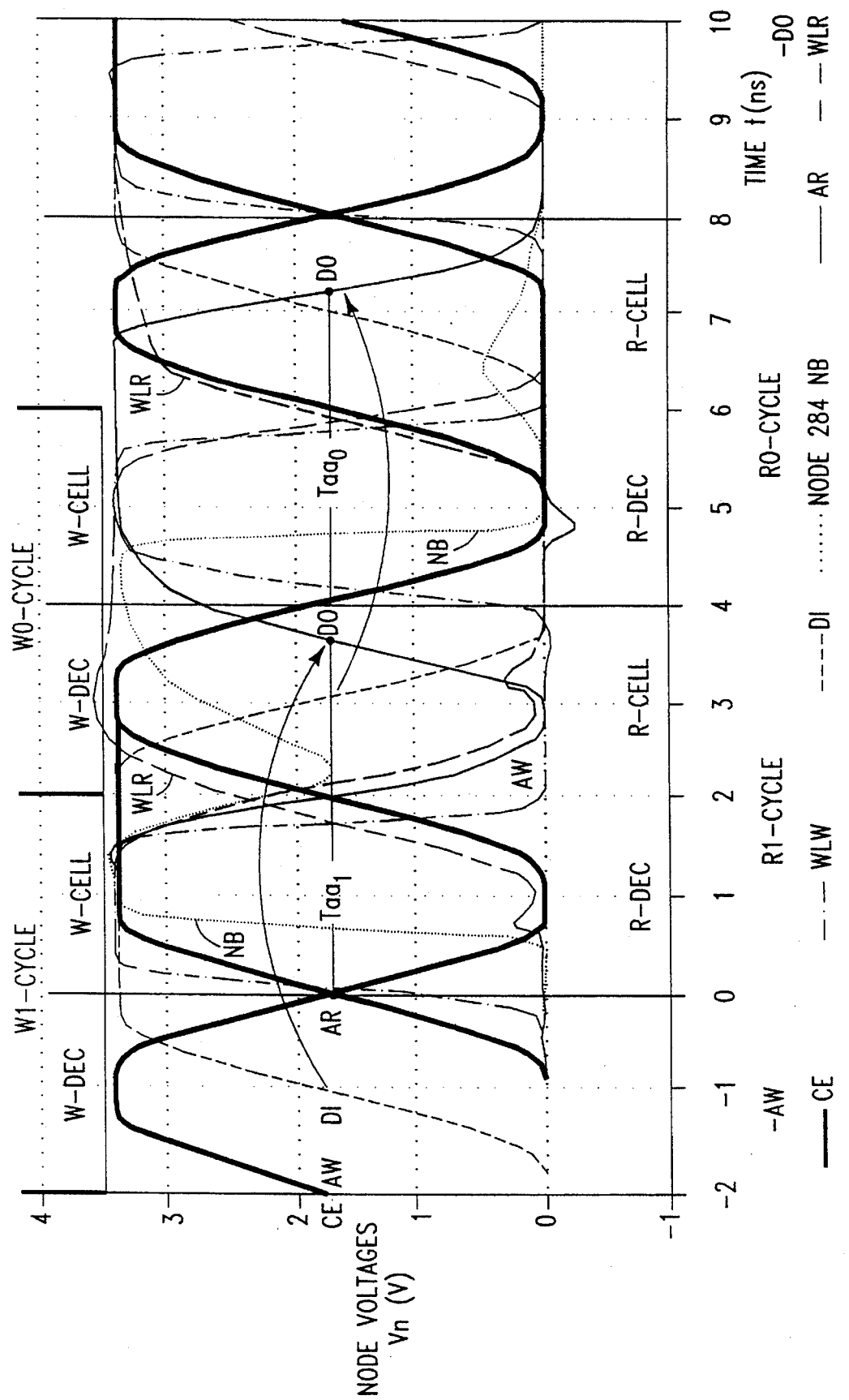
FIG. 6 shows the timing signals and waveforms generated by a computer simulation of the circuit of FIG. 3 when operated in accordance with the interleaved operational mode of FIG. 5.

FIG. 6 shows the results of a computer simulation of the memory of FIG. 3 using the applied control signals shown in FIG. 5. The vertical axis of FIG. 6 shows the value of the voltages of the signals in volts. The horizontal axis is a time scale marked in nanosecond intervals. FIG. 6 shows two complete write and read cycles. The two write cycles are denoted W1-CYCLE and W0-CYCLE and are marked on the top of FIG. 6. The two write cycles are divided into decoding and writing stages in correspondence with FIG. 5, and are similarly marked W-DEC and W-CELL respectively. The two read cycles are denoted R1-CYCLE and R0-CYCLE and are marked on the bottom of FIG. 6. The two read cycles are divided into two decoding and reading stages in correspondence with FIG. 5, denoted R-DEC and R-CELL respectively.

On FIG. 6 are shown the signal values against time for the following signals: address write signal (AW), address read signal (AR), clock signal (CE), signal on write word line 246 (WLW), signal on read word line 256 (WLR), data in signal (DI), data out signal (DO) and signal at the second latch node 284 of the latch 290 (NB). Each of these signals is shown using a different line code on the Figure. In the second read cycle (R0-CYCLE) and second write cycle (W0-CYCLE), the write (WLW) and read (WLR) word line signals produced by the falling edges of write word line signals produced by the falling edges of write address (AW at time 2 ns) and read address (AR at time 4 ns) are shown for a different memory cell attached to the same write (BLW) and read (BLR) bit lines as the memory cell accessed in the first cycle (R1 & W1-CYCLES).

The first write cycle on the Figure is the W1-CYCLE. In this cycle a value of 1 is to be placed into the latch 290 of the memory cell 200. The clock signal (CE) reaches the threshold value above which it is deemed to be "1" (active) at a time of −2 ns. At this time, a valid address write signal (AW) is also present (as previously described the AW signal can be valid before CE becomes valid). At a time of −1 ns, the data in signal (DI) passes the threshold value above which it is deemed to be a logical "1". This value is then written into the latch 290 of the memory cell 200 as described above. The address read signal (AR) becomes valid at time of 0 ns. It is at this point that the first read cycle, R1-CYCLE, begins. Thus, the read decode operation is carried out at the same time the write data is written to the selected cell (i.e. at the same time the selected word line is activated, as indicated by WLW rising at 0 ns). At a time of about 3.5 ns, the data out signal (DO) rises above its threshold value and valid data is obtained at one of the read ports 220. The time from setting up the read address (AR) to receiving a valid data out signal (DO) is approximately 3.5 ns and is shown on FIG. 6 as Taa1. In the prior art solution, the read address signal (AR) has to be valid at the time at which the clock signal (CE) crosses its threshold value. This is 2 ns earlier than in the described simulation and thus, in the prior art solution, the value of Taa1 would be approximately 5.5 ns.

The second write cycle is the W0-CYCLE. In this cycle a value of 0 is to be placed into the latch 290 of a memory cell 200 coupled to the same BLW and BLR lines as the cell written in the W1 cycle. The clock signal (CE) reaches the threshold value above which it is deemed to be "1" (active) at a time of 2 ns. At this time, a valid address write signal (AW) is also present. Thus, note that the write decode for the second access cycle is carried out at the same time the data is being read out of the selected cell for the first access cycle. At a time of 3 ns, the data in signal (DI) passes the threshold value below which it is deemed to be a logical "0". This value is then written into the memory cell 200 as described above. At a time of 4 ns, the address read signal (AR) for the second read cycle, R0-CYCLE, becomes valid as it falls below the threshold value. It is at this point that the second read cycle, R0-CYCLE, begins. Another read word line signal (WLR), is produced which directs the written-thru data from another memory cell to the read ports 220. At a time of about 7.5 ns, the data out signal (DO) falls below its threshold value and a valid reading is obtained at the read ports 220. The time from setting up the second read address signal (AR) to receiving a valid data out signal (DO) is again approximately 3.5 ns and is marked on the Figure as Taa0. As described above this is 2 ns earlier than in the prior art solution.

An important feature of the invention is that it facilitates the foregoing pipelined operations. If the read addresses for write-thru must be valid when CE rises, then pipelining is more difficult because the read cycle must be completed (i.e. the read addresses for a first write-thru cycle must become invalid and the read addresses for a second write-thru cycle become valid) before CE falls to begin the next cycle. So, in pipelining wherein the read address decode operation is to be carried out during writing of the cell, read decode and access must be carried out within a shorter cycle time, because the operation must be completed before the start of the next CE cycle. This would lead a faulty operation because there would be insufficient time to fully cycle the read port. Thus, by timing the read port to be activated by approximately the same time the write port is deactivated (which in turn is provided by using a synchronous write port and asynchronous read port), the invention greatly facilitates operating a multi-port SRAM in a pipelined mode.

Although the present invention has been described above with reference to a particular embodiment thereof, the features of the invention may be modified without departing from the spirit and scope of the invention. For example, while the invention has been described with reference to a particular number of read ports, a particular number of write ports, and a given SRAM cell configuration, other port counts and cell configurations could be used.

What is claimed is:

1. A multi-port memory, comprising:

an array of memory cells, each memory cell being coupled to at least one write port for supplying write data to said memory cell and at least one read port for reading data from said memory cell, said write port and said read port selected by activation of first and second control lines, respectively;

a first plurality of address inputs for receiving a first plurality of address signals for selecting said write port coupled to one of said memory cells;

a second plurality of address inputs for receiving a second plurality of address signals for selecting said read port coupled to one of said memory cells;

a first circuit coupled to said first plurality of address inputs for decoding said first plurality of address signals and activating said first control line;

a second circuit coupled to said second plurality of address inputs for decoding said second plurality of address signals and activating said second control line;

said first circuit activating said first control line before said second circuit activates said second control line, and said first circuit deactivating said first control line at approximately the same time said second circuit activates said second control line; and wherein said second circuit is not synchronized by a clock.

2. The memory of claim 1, wherein said memory is accessed in a write/read access cycle, wherein a write portion of said access cycle comprises a first portion in which a write port is selected and a second portion in which write data is written to a selected memory cell through said selected write port, and wherein a read portion of said access cycle comprises a first portion in which a read port is selected and a second portion in which data is read from a selected memory cell through said selected read port.

3. The memory of claim 2, wherein said second portion of said write portion of said access cycle occurs at the same time as said first portion of said read portion of said access cycle.

4. The memory cell as recited in claim 3, further comprising logic means coupled between said first circuit and said control line.

5. The memory cell as recited in claim 4, wherein said logic means is controlled by a clock signal.

6. The memory cell as recited in claim 1, wherein each of said memory cells comprise first and second cross-coupled inverters, and an output buffer for driving data from said memory cells to said read port.

7. The memory cell as recited in claim 6, wherein said write port comprises a transistor having a control electrode coupled to said first control line, a first controlled electrode receiving a data input, and a second controlled electrode coupled to an input of said first and second cross-coupled inverters.

8. The memory cell as recited in claim 7, wherein said read port comprises a transistor having a control electrode coupled to said second control line, a first controlled electrode coupled to an output of said first and second cross-coupled inverters, and a second controlled electrode coupled to a read bit line.

9. The memory cell as recited in claim 1, wherein said first plurality of address signals are valid before said second plurality of address signals.

10. A multi-port memory, comprising:

a memory cell having means for storing a logic signal;

a write port for writing data to said memory cell;

a read port for reading data from said memory cell;

a plurality of first address inputs for receiving a first address for selecting said write port;

a plurality of second address inputs for receiving a second address for selecting said read port;

first synchronous means for activating said write port in response to said first address upon receipt of a clock signal; and second asynchronous means for activating said read port in response to said second address without receipt of a clock signal, wherein said read port is activated at substantially the same time as data is written to said memory cell storage means.

11. The memory as recited in claim 10, wherein said first synchronous means further comprises:

a first decoder coupled to said first plurality of address inputs and producing a decoded output; and a logic gate having a first input coupled to said decoded output of said first decoder, a second input coupled to said clock signal, and an output coupled to said write port.

12. The memory of claim 11, wherein said second asynchronous means further comprises a second decoder coupled to said second plurality of address inputs and producing an output coupled to said read port.

13. A method for writing data through a multi-port memory cell having a latch, write and read address ports coupled to the latch, a clocked write word line coupled to said write address port, a write bit line coupled to said latch and having data thereon, a static read word line coupled to said read address port, and a read bit line coupled to the latch for reading data from said multi-port memory cell, comprising the steps of:

a) strobing a decoded write address enable signal from said write address port onto said clocked write word line;

b) writing data from said write bit line into said latch;

c) producing a decoded read address enable signal from said read address port onto said static read word line; wherein said step (c) is not synchronized by a clock, said steps (b) and (c) being carried out substantially simultaneously; and d) reading data out of the latch onto a read bit line.

14. The method for writing data through a multi-port memory cell as recited in claim 13 wherein said step (a) additionally comprises the steps of:

decoding the write address in a write address decoder and passing it to an AND gate, the other input of which is connected to a clock signal and the output of which is connected to the write word line.

* * * * *